(12) United States Patent
Liu et al.

(10) Patent No.: US 11,424,227 B2
(45) Date of Patent: Aug. 23, 2022

(54) DISPLAY PANEL, DISPLAY MODULE, AND DISPLAY DEVICE

(71) Applicant: Shenzhen China Star Optoelectronics Semiconductor Display Technology Co., Ltd., Shenzhen (CN)

(72) Inventors: Minggang Liu, Shenzhen (CN); Yong Fan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 265 days.

(21) Appl. No.: 16/619,482

(22) PCT Filed: Oct. 30, 2019

(86) PCT No.: PCT/CN2019/114198
§ 371 (c)(1),
(2) Date: Dec. 5, 2019

(87) PCT Pub. No.: WO2021/007998
PCT Pub. Date: Jan. 21, 2021

(65) Prior Publication Data
US 2021/0335762 A1    Oct. 28, 2021

(30) Foreign Application Priority Data

Jul. 15, 2019 (CN) .......................... 201910633685.6

(51) Int. Cl.
*H01L 25/13* (2006.01)
*H01L 25/075* (2006.01)
(Continued)

(52) U.S. Cl.
CPC .......... *H01L 25/13* (2013.01); *H01L 25/0753* (2013.01); *H01L 27/1218* (2013.01); *H01L 33/62* (2013.01)

(58) Field of Classification Search
CPC combination set(s) only.
See application file for complete search history.

(56) References Cited

U.S. PATENT DOCUMENTS

2008/0001533 A1  1/2008  Kim et al.
2010/0244005 A1  9/2010  Gyoda
(Continued)

FOREIGN PATENT DOCUMENTS

| CN | 101097942 | 1/2008 |
| CN | 101847651 | 9/2010 |
| CN | 103633114 | 3/2014 |

*Primary Examiner* — Ratisha Mehta

(57) ABSTRACT

The present invention provides a display panel, a display module, and a display device. The display panel includes a substrate and micro-LEDs. The display module achieves an extremely-narrow-bezel design by attaching a support plate to one side of a flexible drive circuit board of the display panel, bending a bending region, and attaching a bonding region to another side of the support plate. Multiple display modules are arranged in a accommodating chamber defined by a back plate of the display device and are fixed and joined to each other. Accordingly, a narrow-gap joining technology for micro-LED is realized, thus solving a problem that the micro-LED is too small in size, and realizing large-sized micro-LED displays.

16 Claims, 3 Drawing Sheets

(51) Int. Cl.
 *H01L 27/12* (2006.01)
 *H01L 33/62* (2010.01)

(56) References Cited

U.S. PATENT DOCUMENTS

| | | | |
|---|---|---|---|
| 2015/0048999 A1 | 2/2015 | Hsieh | |
| 2015/0345042 A1* | 12/2015 | Yeh | C25D 5/34 |
| | | | 216/13 |
| 2018/0337367 A1* | 11/2018 | Tomioka | H01L 27/3276 |
| 2020/0028123 A1* | 1/2020 | Xie | B32B 38/0004 |
| 2020/0274104 A1* | 8/2020 | Park | H01L 51/5246 |
| 2021/0004099 A1* | 1/2021 | Sun | G06F 3/045 |

* cited by examiner

DISPLAY PANEL, DISPLAY MODULE, AND DISPLAY DEVICE

RELATED APPLICATIONS

This application is a National Phase of PCT Patent Application No. PCT/CN2019/114198 having International filing date of Oct. 30, 2019, which claims the benefit of priority of Chinese Patent Application No. 201910633685.6 filed on Jul. 15, 2019. The contents of the above applications are all incorporated by reference as if fully set forth herein in their entirety.

FIELD AND BACKGROUND OF DISCLOSURE

The present invention relates to a field of display technology and in particular, to a display panel, a display module, and a display device.

Micro light emitting diodes (micro-LEDs) have advantages such as self-illumination, being small in size, being light in weight, high brightness, longer product lifespans, low power consumption, fast response time, and being more controllable. Therefore, micro-LEDs are considered as a new generation of display technology.

However, at present, a size of the micro-LED is too small to realize a large-sized display.

Therefore, there is a need to solve the problem that the micro-LED is too small in size to realize a large-sized display.

SUMMARY OF THE INVENTION

The present application provides a display panel, a display module, and a display device to solve a problem that a conventional micro-LED is too small in size to realize a large-sized display.

Accordingly, the present invention provides a solution as follows.

The present invention provides a display panel, comprising:
 a substrate;
 a flexible drive circuit board disposed on the substrate, the flexible drive circuit board comprising a display region, a bending region, and a bonding region, wherein a drive circuit is disposed in the display region; and
 a plurality of micro light-emitting-diodes (micro-LEDs) bonded to the display region and arranged corresponding to the drive circuit.

According to the present invention, the display panel further comprises an encapsulation layer.

In the display panel of the present invention, the flexible drive circuit board further comprises a flexible base substrate and a thin-film-transistor (TFT) layer, and the drive circuit is constituted by TFTs of the TFT layer.

In the display panel of the present invention, the flexible base substrate is made of polyimide or polyethylene terephthalate.

In the display panel of the present invention, the flexible base substrate has a thickness ranging from 10 µm to 30 µm.

The present invention provides a display module, comprising:
 a support plate;
 a display panel comprising a flexible drive circuit board and a plurality of micro light-emitting-diodes (micro-LEDs) bonded to a display region of the flexible drive circuit board, wherein the support plate is attached to the flexible drive circuit board within the display region, wherein by bending of a bending region of the flexible drive circuit board, a bonding region of the flexible drive circuit board is disposed on another side of the support plate; and
 a drive unit disposed in the bonding region of the flexible drive circuit board and bonded to the display panel.

In the display module of the present invention, the support plate is made of one of glass, polyimide, polyethylene terephthalate, and poly-aluminum chloride.

In the display module of the present invention, a size of the support plate is smaller than a size of the display region of the display panel.

In the display module of the present invention, a size of the support plate is the same as a size of the display region of the display panel.

In the display module of the present invention, the bending region comprises a first bending region and a second bending region, and the first bending region and the second bending region are in contact with the display region and arranged at two opposite sides of the display region.

In the display module of the present invention, the bending region is disposed at one side of the display region and in contact with the display region.

In the display module of the present invention, a distance from a center of one row of the micro-LEDs closest to the bending region to a side edge of the display module is less than half a distance between each two adjacent micro-LEDs in the display region.

In the display module of the present invention, the bending region of the display panel is in contact with a side edge of the support plate.

In the display module of the present invention, the bending region of the display panel is not in contact with a side edge of the support plate.

In the display module of the present invention, the display panel further comprises an encapsulation layer.

In the display module of the present invention, the flexible drive circuit board further comprises a flexible base substrate and a thin film transistor (TFT) layer, and the drive circuit is constituted by TFTs of the TFT layer.

In the display module of the present invention, the flexible base substrate is made of polyimide or polyethylene terephthalate.

In the display module of the present invention, the flexible base substrate has a thickness ranging from 10 µm to 30 µm.

The present invention provides a display device, comprising:
 a back plate defining an accommodating chamber; and
 at least two display modules mentioned above, wherein the at least two display modules are coupled to each other in the accommodating chamber.

In the display device of the present invention, a distance from a center of one row of the micro-LEDs closest to the bending region to a side edge of the display module is less than half a distance between each two adjacent micro-LEDs in the display region.

Advantages of the Present Invention:

The present invention provides a display panel, a display module, and a display device. The display panel comprises a substrate and a plurality of micro-LEDs. In the display module, a glass substrate on the flexible drive circuit board of the display panel is removed, the support plate is attached to one side of the flexible drive circuit board within the display region of the display panel, the bending region of the flexible drive circuit board is bent, and a bonding region is attached to another side of the support plate, thereby realizing an extremely-narrow-bezel design of the display module. Then, a plurality of display modules with the extremelynarrow-bezel design are arranged in the accommodating chamber defined by the back plate of the display device to be fixed and joined to each other. Accordingly, a narrow-gap joining technology for micro-LED is realized, which solves the problem that the micro-LED is too small in size and achieves large-sized micro-LED displays, and the display modules can be joined together as desired to form a screen of any size and resolution.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DESCRIPTION OF SPECIFIC EMBODIMENTS OF THE INVENTION

Figure 1:
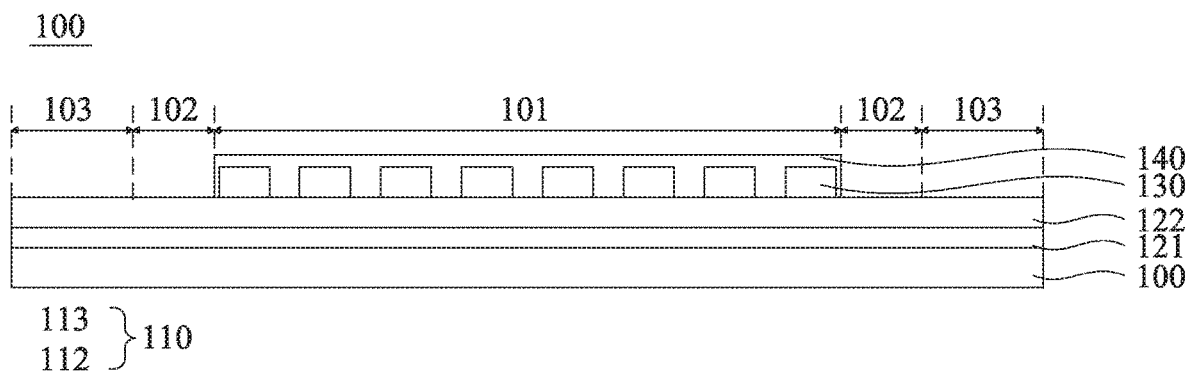
FIG. 1 is a schematic structural view illustrating a display panel according to one embodiment of the present invention.

The following description is provided to illustrate specific embodiments of the present invention. Directional terms, such as "upper", "lower", "previous", "rear", "left", "right", "inside", "outside", and "lateral" in the present disclosure, are only illustrative with reference to the accompanying drawings. Therefore, the directional terms are only for the purpose of illustration and ease of understanding, and are not intended to be limiting. In the figures, structurally similar elements are denoted by the same reference numerals.

Conventional micro light emitting diode (micro-LED) displays are too small to realize large-sized displays. In solution, the present application provides a display panel, a display module, and a display device.

As shown in FIG. 1, according to one embodiment of the present invention, the display panel 100, comprising:

a substrate 110;

a flexible drive circuit board 120 disposed on the substrate 110, the flexible drive circuit board 120 comprising a display region 101, a bending region 102, and a bonding region 103, wherein a drive circuit is disposed in the display region 101; and a plurality of micro light-emitting-diodes (micro-LEDs) 130 bonded in the display region 101 and arranged corresponding to the drive circuit.

In the present embodiment, the drive circuit board of the display panel is flexible, thus achieving flexibility of the display panel, an extremely narrow bezel design of a display module, and a large-sized micro-LED display device.

Referring to FIG. 1, according to one embodiment of the present invention, the display panel 100 further comprises an encapsulation layer 140. The encapsulation layer 140 covers the flexible drive circuit board 120 and the micro-LEDs 130 to protect the flexible drive circuit board 120 and the micro-LEDs 130. The encapsulation layer 140 includes a first inorganic encapsulation layer, a second inorganic encapsulation layer, and an organic encapsulation layer between the first inorganic encapsulation layer and the second inorganic encapsulation layer, wherein the first inorganic encapsulation layer and the second inorganic encapsulation layer are made of silicon nitride or silicon oxynitride and provides water barrier and oxygen barrier properties to prevent water or oxygen outside the display panel from entering the display panel. The organic encapsulation layer is made of one or more of polymethyl methacrylate, methyl methacrylate, and etc. The organic encapsulation layer is disposed between the first inorganic encapsulation layer and the second inorganic encapsulation layer to help improve flexibility of the encapsulation layer.

According to one embodiment of the present invention, the flexible drive circuit board 120 further comprises a flexible base substrate 121 and a thin-film-transistor (TFT) layer 122, and the drive circuit is constituted by TFTs of the TFT layer 122.

The flexible base substrate 121 is a flexible plate made of a flexible insulating material and has properties such as being stretchable, bendable, and flexible. The flexible insulating material may be polyimide (PI), polyethylene terephthalate (PET), polycarbonate (PC), or other flexible material; and the present invention is not limited in this regard. The flexible base substrate 121 has a thickness ranging from 10 μm to 30 μm.

The TFT layer 122 includes an active layer, a gate electrode layer, a source/drain electrode layer, a gate insulating layer disposed between the active layer and the gate electrode layer, and an interlayer insulating layer disposed between the gate electrode layer and the source/drain electrode layer. In the present embodiment, the TFT layer 122 may be constituted by top-gate TFTs, bottom-gate TFTs, or single-gate TFTs, or double-gate TFTs; and the present invention is not limited in this regard.

In one embodiment, the micro-LEDs 130 include a green micro-LED, a red micro-LED, and a blue micro-LED. The green micro-LED is used to emit green light, the red micro-LED is used to emit red light, and the blue micro-LED is used to emit blue light. The micro-LED comprises a substrate layer, and also comprises an intrinsic layer, an N-type gallium nitride layer, a multiple quantum well layer, a P-type gallium nitride layer, an insulating layer, an electric current diffusion layer, a protective layer, an N-type electrode layer, and a p-type electrode layer which are sequentially stacked on the substrate layer. The substrate layer is generally a sapphire substrate. The multiple quantum well layer is disposed between the N-type gallium nitride layer and the P-type gallium nitride layer. The multiple quantum well layer is generally a multi-layer structure constituted by an indium gallium nitride layer and a gallium nitride layer alternately stacked on each other and decides illuminating colors of the micro-LEDs 130. The insulating layer and the protective layer are generally made of an insulating material such as silicon oxide or silicon nitride. Material of the electric current diffusion layer is generally transparent indium tin oxide, or may be graphene or other metal. The N-type electrode layer and the p-type electrode layer are one of platinum, gold, nickel, chromium, the like, and an alloy thereof.

In another embodiment, the micro-LED 130 includes a base and a blue micro-LED disposed on the base, the blue micro-LED is mounted to the base in a normal, inverted, or vertical manner. The blue micro-LED is sequentially coated with an encapsulating layer, a phosphor layer, a quantum dot layer and a water/oxygen barrier layer. The encapsulating layer is made of one or more materials such as an anti-vulcanization agent, a silicone rubber, and a silicone resin. The phosphor layer is obtained by dispersing phosphor powder in a transparent colloid, and the transparent colloid consists of one or more of silica gel, polymethyl methacrylate, polycarbonate, or polystyrene, and the phosphor powder has a light wavelength from 450 nm to 600 nm. The quantum dot layer is obtained by dispersing quantum dot micro-spheres in a transparent colloid which consists of one or more of silica gel, polymethyl methacrylate, polycarbonate, and polystyrene, and the quantum dot micro-spheres can be large or small in size, with an average particle diameter ranging from 0.1 μm to 100 μm and a light wavelength ranging from 500 nm to 750 nm. The water/oxygen barrier layer comprises a water/oxygen barrier film and a water/oxygen barrier colloid layer covering the water/oxygen barrier film. The water/oxygen barrier film is one or more of a polyimide film, a polyethylene terephthalate (PET) film, a PET-based composite film, a polymethyl methacrylate film or a polyvinyl alcohol film, and the water/oxygen barrier film covers an upper surface of an inner cavity of the base. The water/oxygen barrier colloid layer consists of one or more of silica gel, silicone rubber, silicone resin, polymethyl methacrylate, polyvinyl alcohol, and epoxy resin.

The micro-LEDs 130 can be disposed on the flexible driving circuit board 120 through a mass transfer process, and are bonded to the display region corresponding to the drive circuit in the flexible drive circuit board 120. The mass transfer process can pick up and transfer the micro-LEDs 130 onto the flexible drive circuit board 120 by vacuum, electrostatic, or magnetic methods. The micro-LEDs 130 are connected to the flexible drive circuit board 120 through an adhesive layer and a bonding layer, wherein the adhesive layer is used for bonding micro-LED chips to the flexible drive circuit board 120; the bonding layer is used to electrically connect the micro-LED chips to the drive circuit of the flexible drive circuit board, so that the micro-LED chips can be driven by the drive circuit to emit light. Material of the adhesive layer can be any adhesive material known to those skilled in the art, such as an optical glue, a temperature sensitive adhesive, and a pressure sensitive adhesive; material of the adhesive layer is not limited herein. Material of the bonding layer is a metal conductive material, such as a metal solder material or a conductive adhesive layer, and the metal material may be formed into the bonding layer by a soldering process to electrically connect the drive circuit on the flexible drive circuit board. The conductive adhesive layer, such as an anisotropic conductive film (ACF), is electrically connected to the drive circuit on the flexible drive circuit board by direct adherence to the drive circuit.

Figure 2:
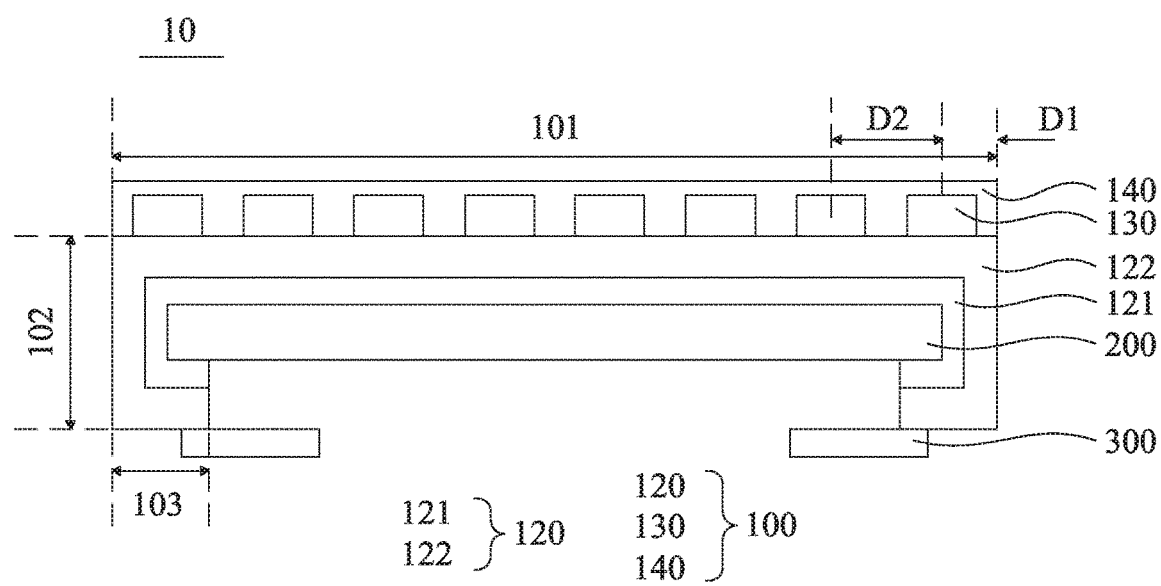
FIG. 2 is a schematic structural view illustrating a display module according to one embodiment of the present invention.
Figure 3:
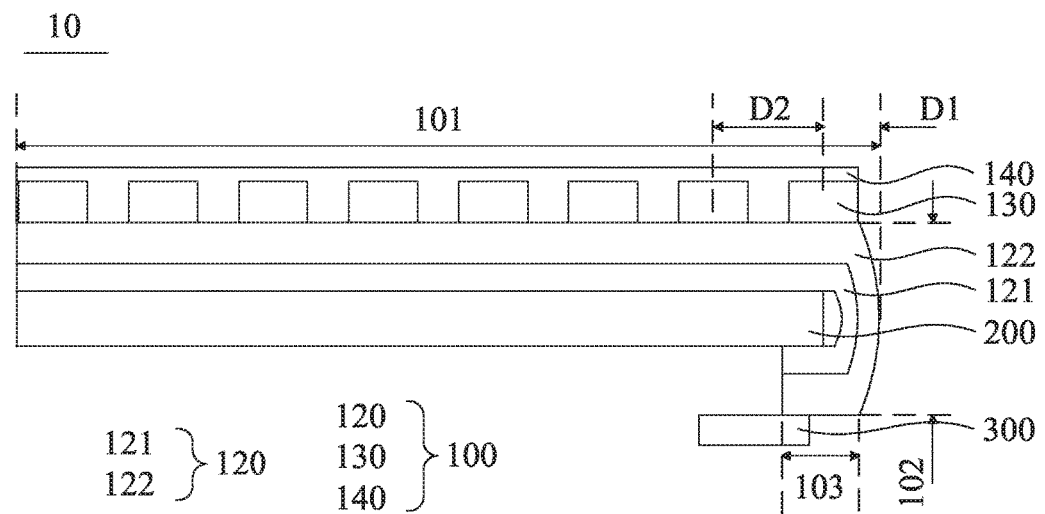
FIG. 3 is a schematic structural view illustrating the display module according to another embodiment of the present invention.

Referring to FIGS. 2 and 3, according to one embodiment of the present invention, the present invention provides a display module 10, comprising:

a support plate 200;

a display panel 100 comprising a flexible drive circuit board 120 and a plurality of micro light-emitting-diodes (micro-LEDs) 130 bonded in a display region 101 of the flexible drive circuit board 120, wherein the support plate 200 is attached to the flexible drive circuit board 120 within the display region 101, wherein by bending of a bending region 102 of the flexible drive circuit board 120, a bonding region 103 of the flexible drive circuit board 120 is disposed on another side of the support plate 200; and a drive unit 300 disposed in the bonding region 102 of the flexible drive circuit board 120 and bonded to the display panel 100.

The drive unit 300 comprises a chip-on-film structure and a printed circuit board. One end of the chip-on-film structure is bonded to the bonding region of the display panel through an anisotropic conductive adhesive, and another end of the chip-on-film structure is bonded to the printed circuit board through an anisotropic conductive adhesive.

The present invention provides a display module. The display module comprises a support plate, a display panel, and a drive unit. The support plate is attached to the flexible drive circuit board within the display region. By bending of a bending region of the flexible drive circuit board, a bonding region of the flexible drive circuit board is disposed on another side of the support plate. Accordingly, an extremely-narrow-bezel design of the display module is realized.

In one embodiment, the support plate 200 is a film structure having a certain stiffness. The display panel without a glass substrate is easily warped since the flexible base substrate is too soft. This is disadvantageous for subsequent manufacturing processes and normal display of the display panel. The support plate 200 can be made of an inorganic material such as glass or poly-aluminum chloride, or can be made of an organic material such as polyimide or polyethylene terephthalate. When the support plate is a glass plate, side edges of the glass plate need to be polished to prevent damage to the display panel during bending of the bending region of the display panel. The support plate can be made of an organic material such as resin, a sealant or other adhesive, and material of the support plate may be the same as that of the flexible base substrate.

According to one embodiment of the present invention, a size of the support plate 200 is similar to a size of the display region of the display panel. The size of the support plate 200 can be the same as the size of the display region of the display panel, or can be smaller or larger than the size of the display region of the display panel; configuration may vary as required.

According to one embodiment of the present invention, a distance D1 from a center of one row of the micro-LEDs closest to the bending region to a side edge of the display module is less than half a distance D2 between each two adjacent micro-LEDs in the display region.

In one embodiment, as shown in FIG. 2, the bending region 102 of the display panel is in contact with a side edge of the support plate 200. The glass substrate is removed from the bending region 102 of the display panel, and the support plate or other structure that hinders flexibility of the display panel is not disposed in the bending region 102 of the display panel, so the bending region 102 of the display panel has excellent bending performance, and the bending region 102 of the display panel is bent around a periphery of the support plate 200 to conform to the side edge of the support plate 200. After the bending, the distance D1 from the center of one row of the micro-LEDs closest to the bending region to the side edge of the display module is minimized. In the present embodiment, it is necessary to ensure that the side edge of the support plate 200 have smooth and even surfaces without burrs to avoid damage to the flexible base substrate 121 during the bending of the bending region 102 of the display panel.

In one embodiment, as shown in FIG. 3, the bending region 102 of the display panel is not in contact with the side edge of the support plate 200. The bending region 102 of the display panel comprises not only the flexible base substrate 121 but also the TFT layer 122, and the TFT layer 122 comprises organic and inorganic film layers, so the bending region of the display panel has certain rigidity. During the bending of the bending region, the bending region of the display panel is subjected to a certain bending stress, resulting in a gap between the bending region 102 of the display panel and the side edge of the support plate 200 after the bending. In the present embodiment, the curvature of the bending region of the display panel can be adjusted by changing a thickness of the support plate 200 and adding an auxiliary adjustment film layer in the bending region of the display panel.

In one embodiment, as shown in FIG. 2, the bending region 102 includes a first bending region and a second bending region, the first bending region and the second bending region are in contact with the display region 101, and are respectively disposed at two opposite sides of the display region 101.

According to another embodiment of the present invention, as shown in FIG. 3, the bending region 102 is disposed at one side of the display region 101 and is in contact with the display region 101.

According to one embodiment of the present invention, the display panel further comprises an encapsulation layer.

According to one embodiment of the present invention, the flexible drive circuit board further comprises a flexible base substrate and a thin film transistor (TFT) layer, and the drive circuit is constituted by TFTs of the TFT layer.

According to one embodiment of the present invention, the flexible base substrate is made of polyimide or polyethylene terephthalate.

According to one embodiment of the present invention, the flexible base substrate has a thickness ranging from 10 µm to 30 µm.

Figure 4:
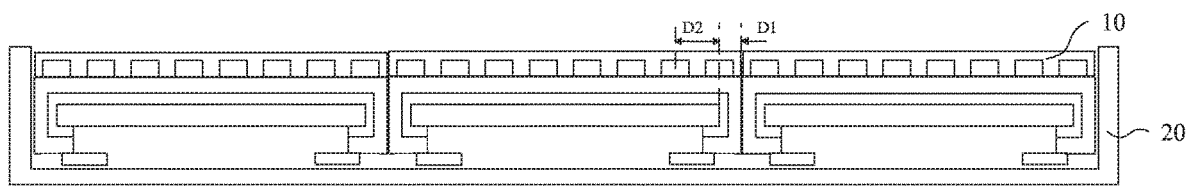
FIG. 4 is a schematic structural view illustrating a display device according to one embodiment of the present invention.
Figure 5:
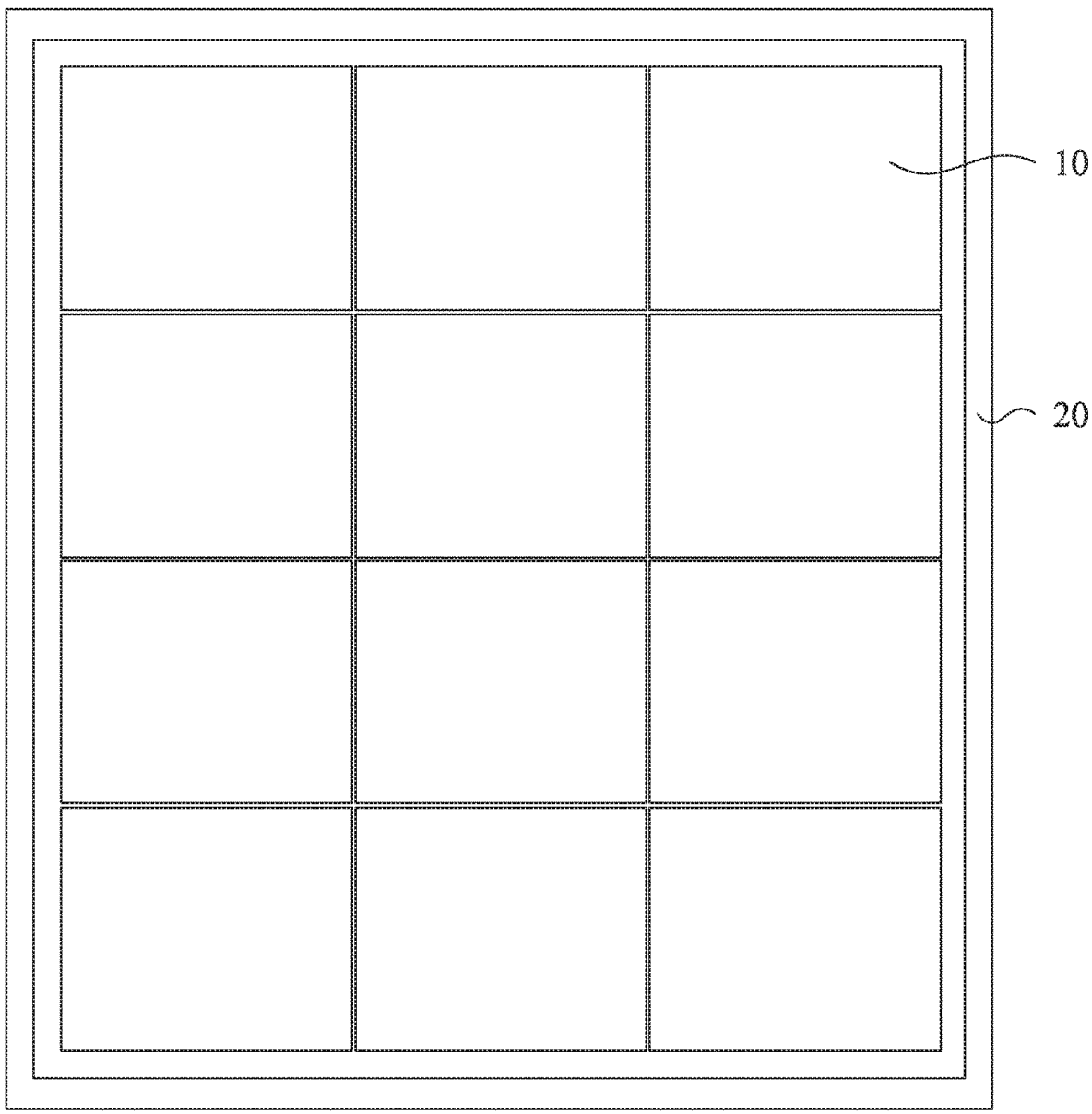
FIG. 5 is a top view illustrating a display device according to one embodiment of the present invention.

Referring to FIGS. 4 and 5, a display device is provided according to one embodiment of the present invention, comprising:
  a back plate 20 defining an accommodating chamber; and
  at least two display modules 10 coupled to each other in the accommodating chamber, wherein the display module 10 comprises:
    a display panel;
    a support plate attached to the flexible drive circuit board within the display region of the display panel;
    a drive unit disposed in a bonding region of the flexible drive circuit board of the display panel, wherein by bending of a bending region of the flexible drive circuit board, the bonding region of the flexible drive circuit board is disposed on another side of the support plate.

In the present invention, multiple display modules with the extremely-narrow-bezel-design are disposed in the accommodating chamber defined by the back plate of the display device, and are fixed and coupled to each other, thereby achieving a narrow-gap joining technology for micro-LED, and solving the problem that the micro-LED is too small in size, realizing a large-sized micro-LED display, and at the same time, the display modules can be joined as desired to form a screen of any size and resolution.

According to one embodiment of the present invention, the display panel further comprises an encapsulation layer.

According to one embodiment of the present invention, the flexible drive circuit board further comprises a flexible base substrate and a thin-film-transistor (TFT) layer, and the drive circuit is constituted by TFTs of the TFT layer.

According to one embodiment of the present invention, the flexible base substrate is made of polyimide or polyethylene terephthalate.

According to one embodiment of the present invention, the flexible base substrate has a thickness ranging from 10 µm to 30 µm.

According to one embodiment of the present invention, the support plate is made of one of glass, polyimide, polyethylene terephthalate, and poly-aluminum chloride.

According to one embodiment of the present invention, a size of the support plate is smaller than a size of the display region of the display panel.

According to one embodiment of the present invention, a size of the support plate is the same as a size of the display region of the display panel.

According to one embodiment of the present invention, the bending region comprises a first bending region and a second bending region, and the first bending region and the second bending region are in contact with the display region and arranged at two opposite sides of the display region.

According to one embodiment of the present invention, the bending region is disposed at one side of the display region and in contact with the display region.

According to one embodiment of the present invention, a distance from a center of one row of the micro-LEDs closest to the bending region to a side edge of the display module is less than half a distance between each two adjacent micro-LEDs in the display region. After the display modules are coupled and the display device is assembled, in order to achieve normal display of the display device without causing dark lines or uneven display, it is necessary to provide uniform light mixture between each two adjacent display modules coupled together, so a distance between micro-LED pixels on inner edges of each two adjacent display modules needs to be less than or equal to a distance between each two adjacent micro-LED pixels in the display module.

According to one embodiment of the present invention, the present invention provides a manufacturing method of a display module, comprising:
  S1: providing a display panel;
  S2: bonding a drive unit to a bonding region of the display panel;
  S3: removing a glass substrate on a flexible drive circuit board of the display panel;
  S4: attaching a support plate to one side of a flexible base substrate away from micro-LEDs and in a display region of the display panel; and
  S5: bending a bending region of the display panel and attaching the bonding region of the display panel to the support plate.

According to one embodiment of the present invention, the step of providing the display panel comprises:
  S11: manufacturing the flexible drive circuit board;
  S12: manufacturing the micro-LEDs; and
  S13: transferring the micro-LEDs onto the flexible drive circuit board and connecting the micro-LEDs to the flexible drive circuit board.

According to one embodiment of the present invention, the step of manufacturing the flexible drive circuit board comprises:
  S111: providing the glass substrate;
  S112: manufacturing the flexible base substrate on the glass substrate; and
  S113: manufacturing a thin-film-transistor layer on the flexible base substrate;

In one embodiment of the present invention, the step of removing the glass substrate on the flexible drive circuit board of the display panel comprises:
  S31: attaching a temporary substrate to one side of the display panel near the micro-LEDs by using an adhesive such as a temperature sensitive adhesive/photosensitive adhesive, wherein the temporary substrate is a glass substrate, a TAC substrate, or a PET substrate; and S32: separating the flexible base substrate from the glass substrate of the display panel by laser stripping to remove the glass substrate.

According to one embodiment of the present invention, the step of attaching the support plate to one side of the flexible base substrate away from the micro-LEDs and in the display region of the display panel comprises:

S41: using a double-sided adhesive tape or an adhesive to attach the support plate to one side of the flexible base substrate away from the micro-LEDs and in the display region of the display panel.

According to one embodiment of the present invention, the step of bending the bending region of the display panel and attaching the bonding region of the display panel to the support plate comprises:

S51: bending the bending region of the display panel; and

S52: using a double-sided adhesive tape or an adhesive to attach the bonding region of the display panel to the support plate.

In Summary:

The present invention provides a display panel, a display module, and a display device. The display panel comprises a substrate and a plurality of micro-LEDs. In the display module, a glass substrate on the flexible drive circuit board of the display panel is removed, the support plate is attached to one side of the flexible drive circuit board within the display region of the display panel, the bending region of the flexible drive circuit board is bent, and a bonding region is attached to another side of the support plate, thereby realizing an extremely-narrow-bezel design of the display module. Then, a plurality of display modules with the extremely-narrow-bezel design are arranged in the accommodating chamber defined by the back plate of the display device and are fixed and joined to each other. Accordingly, a narrow-gap joining technology for micro-LED is realized, thus solving the problem that the micro-LED is too small in size, realizing large-sized micro-LED displays, and the display modules can be joined together as desired to form a screen of any size and resolution.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A display module, comprising:
a support plate in an integral form;
a display panel comprising a flexible drive circuit board and a plurality of micro light-emitting-diodes (micro-LEDs) bonded inside a display region of the flexible drive circuit board, wherein the support plate is attached to the flexible drive circuit board within the display region, wherein by bending of a bending region of the flexible drive circuit board, a bonding region of the flexible drive circuit board is disposed on another side of the support plate, wherein the bending region of the flexible drive circuit board is bent along a lateral side of the support plate, and wherein a distance from a center of one row of the micro-LEDs closest to the bending region to an outermost side edge of the display module is less than half a distance between each two adjacent micro-LEDs in the display region; and
a drive unit disposed in the bonding region of the flexible drive circuit board and bonded to the display panel.

2. The display module according to claim 1, wherein the support plate is made of one of glass, polyimide, polyethylene terephthalate, and poly-aluminum chloride.

3. The display module according to claim 1, wherein a size of the support plate is smaller than a size of the display region of the display panel.

4. The display module according to claim 1, wherein a size of the support plate is the same as a size of the display region of the display panel.

5. The display module according to claim 1, wherein the bending region comprises a first bending region and a second bending region, and the first bending region and the second bending region are in contact with the display region and arranged at two opposite sides of the display region.

6. The display module according to claim 1, wherein the bending region is disposed at one side of the display region and in contact with the display region.

7. The display module according to claim 1, wherein the bending region of the display panel is in contact with a side edge of the support plate.

8. The display module according to claim 1, wherein the display panel further comprises an encapsulation layer.

9. The display module according to claim 1, wherein the flexible drive circuit board further comprises a flexible base substrate and a thin film transistor (TFT) layer, and the drive circuit is constituted by TFTs of the TFT layer.

10. The display module according to claim 1, wherein the flexible base substrate is made of polyimide or polyethylene terephthalate.

11. The display module according to claim 1, wherein the flexible base substrate has a thickness ranging from 10 µm to 30 µm.

12. A display device, comprising:
a back plate defining an accommodating chamber; and
at least two display modules of claim 1, wherein the at least two display modules are coupled to each other in the accommodating chamber.

13. The display device according to claim 12, wherein a size of the support plate is smaller than or a same as a size of the display region of the display panel.

14. The display device according to claim 12, wherein the bending region comprises a first bending region and a second bending region in contact with the display region and arranged at two opposite sides of the display region, or the bending region is disposed at one side of the display region and in contact with the display region.

15. The display device according to claim 12, wherein the bending region of the display panel is in contact with a side edge of the support plate.

16. The display device according to claim 12, wherein the display panel further comprises an encapsulation layer, the flexible drive circuit board further comprises a flexible base substrate and a thin film transistor (TFT) layer, and the drive circuit is constituted by TFTs of the TFT layer.

* * * * *